(12) United States Patent
Lin et al.

(10) Patent No.: US 6,396,089 B1
(45) Date of Patent: May 28, 2002

(54) SEMICONDUCTOR IMAGE SENSOR

(75) Inventors: Shih-Yao Lin; Shu-Li Chen, both of Hsinchu Hsien; Jeenh-Bang Yeh, Tainan, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/292,454

(22) Filed: Apr. 15, 1999

(51) Int. Cl.⁷ ............................................. H01L 27/148
(52) U.S. Cl. ...................... 257/225; 257/291; 257/448; 257/459
(58) Field of Search ................................ 257/225, 222, 257/291, 448, 459

(56) References Cited

U.S. PATENT DOCUMENTS

| | | | | |
|---|---|---|---|---|
| 4,676,867 A | * | 6/1987 | Elkins et al. ............... 257/752 |
| 5,461,254 A | * | 10/1995 | Tsai et al. .................. 257/646 |
| 5,874,188 A | * | 2/1999 | Roberts et al. ............. 430/7 |
| 5,889,277 A | * | 3/1999 | Hawkins et al. ......... 250/208.1 |
| 6,111,247 A | * | 8/2000 | Sengupta .................... 257/440 |

* cited by examiner

*Primary Examiner*—Sara Crane

(57) ABSTRACT

A semiconductor image sensor includes a bonding pad formed on a semiconductor substrate. An oxide layer is disposed over the semiconductor substrate to cover the bonding pad. A SOG is disposed on the oxide layer, a silicon-oxy-nitride layer is disposed on the SOG and a color filter is disposed thereon. By using the high transmittance of the SOG and the silicon-oxy-nitride layer, the blue light transmittance by the semiconductor image sensor is therefore enhanced.

5 Claims, 5 Drawing Sheets

SEMICONDUCTOR IMAGE SENSOR

BACKGROUND OF THE INVENTION

1. Field of the Invention

The invention relates to an image sensor. More particularly, the invention concerns a structure for an image sensor integrated with the semiconductor device having enhanced blue light transmittance.

2. Description of the Related Art

Charge coupled devices (CCD) are currently used as image sensors. CCD technology has been developed over many years and is now mature and stable. Complementary metal oxide semiconductor (CMOS) image sensor technology is newer than CCD technology but is lower in resolution and quality than a CCD. However, a CMOS image sensor still has other advantages such as lower fabrication costs due to the use of the CMOS fabrication process.

Although the technology for the CMOS image sensor is not stable and most of processes are still being researched, when compared with the CCD, the CMOS image sensor is more easily integrated with a wafer, for purposes such as image processing. Accordingly, the integration of IC devices for a CMOS image sensor can therefore be greatly increased. Fabrication costs are thereby brought down, dimensions are reduced, and power consumption is decreased. All these advantages enlarge the value of an IC device. Therefore, it is predicted that the CMOS image sensor will take the place of the CCD and play a main role in the future.

However, with respect to a CMOS image sensor, transmittance of light for the semiconductor structure used in a semiconductor image sensor is an important factor that seriously influences the quality of the image sensor. For example, it is imperative that the light transmittance is high enough. Only a high transmittance enables the light to arrive at the depletion region with a sufficiently high electric field in the semiconductor substrate. Upon arrival, the transmitted light induces electron-hole pairs due to excitation of photo-energy and thereby produces current in the intrinsic depletion region when light with varied wavelengths penetrates the passivation layer protecting the semiconductor structure.

Referring to FIG. 1, a bonding pad 102 is formed over a semiconductor substrate 100 having a CMOS sensor (not shown) to connect with the device on the semiconductor 100. A passivation layer 104 consisting of phosphosilicate glass (PSG) and silicon nitride ($SiN_x$) with a thickness of about 5000 angstroms and about 7000 angstroms, respectively, is formed on the bonding pad 102 to protect the underlying devices from being damaged. Due to the formation of devices on the semiconductor substrate 100, and especially to the presence of the bonding pad 102, the surface of passivation 104 is extremely uneven. It is necessary to form a plain film 106 on the passivation 104 to planarize the passivation layer topography. The plain film 106 can be made from polyimide or acrylic resin, for example, to a thickness of about 16000 angstroms. Thereafter, a color filter 108 is formed on the plain film 106 and light reaches the semiconductor substrate 100 through the color filter 108.

Blue light transmittance by the silicon nitride in the passivation layer 104 is about 70% when the light passes through the blue color filter 108, since wavelength of the blue light, about 460 nanometers, is shorter, as shown in FIG. 2. The curve 200 in FIG. 2 represents the transmittance of the silicon nitride when the light passes through the blue color filter to penetrate the silicon nitride. In addition, transmittance of the plain film 106 as the light passes through is about 95%. As a result, the total transmittance of these two films is merely approximately 66.5%. The poor transmittance of blue light by the silicon nitride causes the semiconductor substrate 100 to receive insufficient light for current induction, leading to erroneous information.

In addition, since the plain film itself is made from polymeric material, polymer is easily produced and covers the wafer when etching the plain film 104 and passivation layer 104 to expose the bonding pad. The etching rate of the layers obviously decreases when the polymer covers the layers that need to be etched. Also, the plain film 106 is almost 16000 angstroms thick. The etching process is difficult to carry out for these reasons. Accordingly, the etching process for the wafer requires at least 6 minutes and preventive maintenance (PM) to keep the reaction chamber clean is required after etching 15 wafers. As the etching time is too long, the interval between preventive maintenances is too short and etchant for etching the plain film 106 is also expensive, there is no potential for using this process to fabricate a semiconductor image sensor in line and produce product in quantity.

SUMMARY OF THE INVENTION

This invention therefore provides a semiconductor image sensor whose blue light transmittance is enhanced.

The invention also provides a semiconductor image sensor that can reduce the etching time and prolong the interval between the PMs. As a result, the manufacturing cost is lowered and the semiconductor image sensor is suitable for line production in quantity.

To achieve these objects and advantages, and in accordance with the purpose of the invention, as embodied and broadly described herein, the invention is directed towards a semiconductor image sensor including a semiconductor with a bonding pad. An oxide layer is disposed on the semiconductor to cover the bonding pad. A spin on glass (SOG) covers the oxide layer. A silicon-oxy-nitride layer ($SiO_xN_y$) covers the SOG, and a color filter is disposed on the silicon-oxy-nitride layer.

This invention utilizes a silicon-oxy-nitride layer and a SOG with high transmittance to replace the silicon nitride passivation layer and the plain film in prior art. Not only the transmittance of the semiconductor image sensor is enhanced, but also the topography of the films underlying the color filter is planar.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 5 shows transmittance of silicon-oxy-nitride layer when light passes through.

DESCRIPTION OF THE PREFERRED EMBODIMENTS

Figure 1:
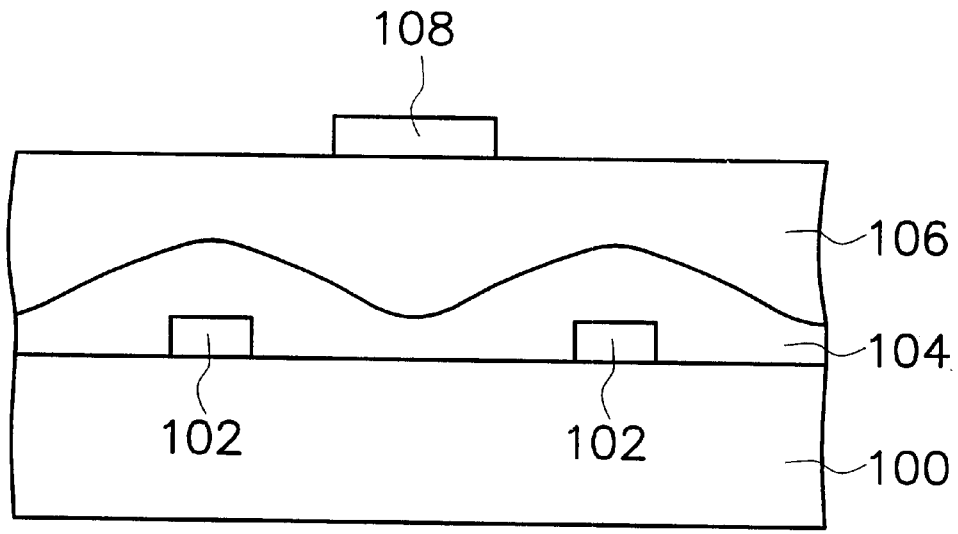
FIG. 1 is a schematic, cross-sectional view illustrating a semiconductor image sensor in prior art.

Reference will now be made in detail to the present preferred embodiments of the invention, examples of which are illustrated in the accompanying drawings. Wherever possible, the same reference numbers are used in the drawings and the description to refer to the same or like parts.

Figure 3:
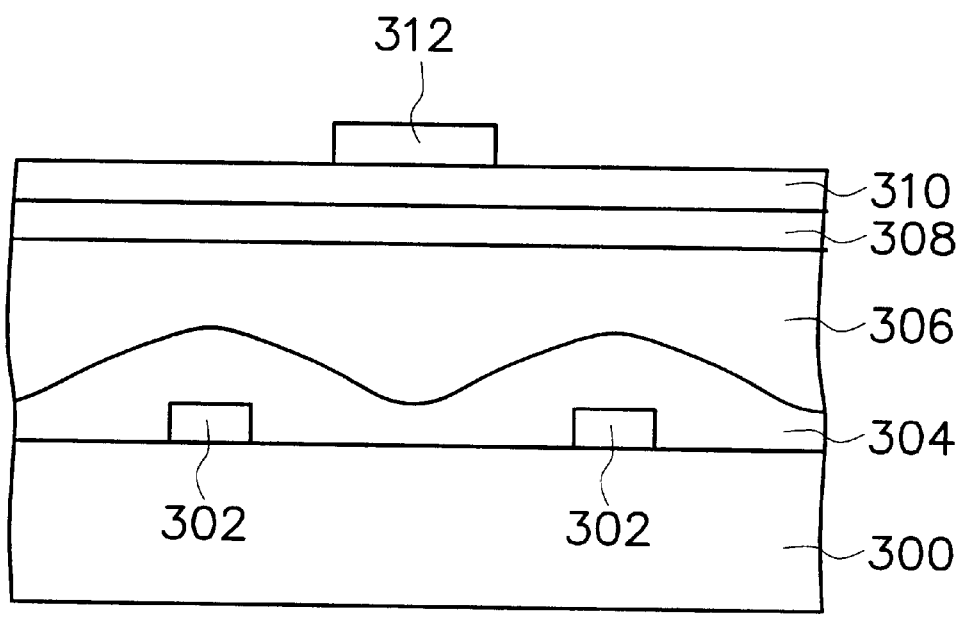
FIG. 3 is a schematic, cross-sectional view illustrating a semiconductor image sensor in a preferred embodiment according to the invention.
Figure 2:
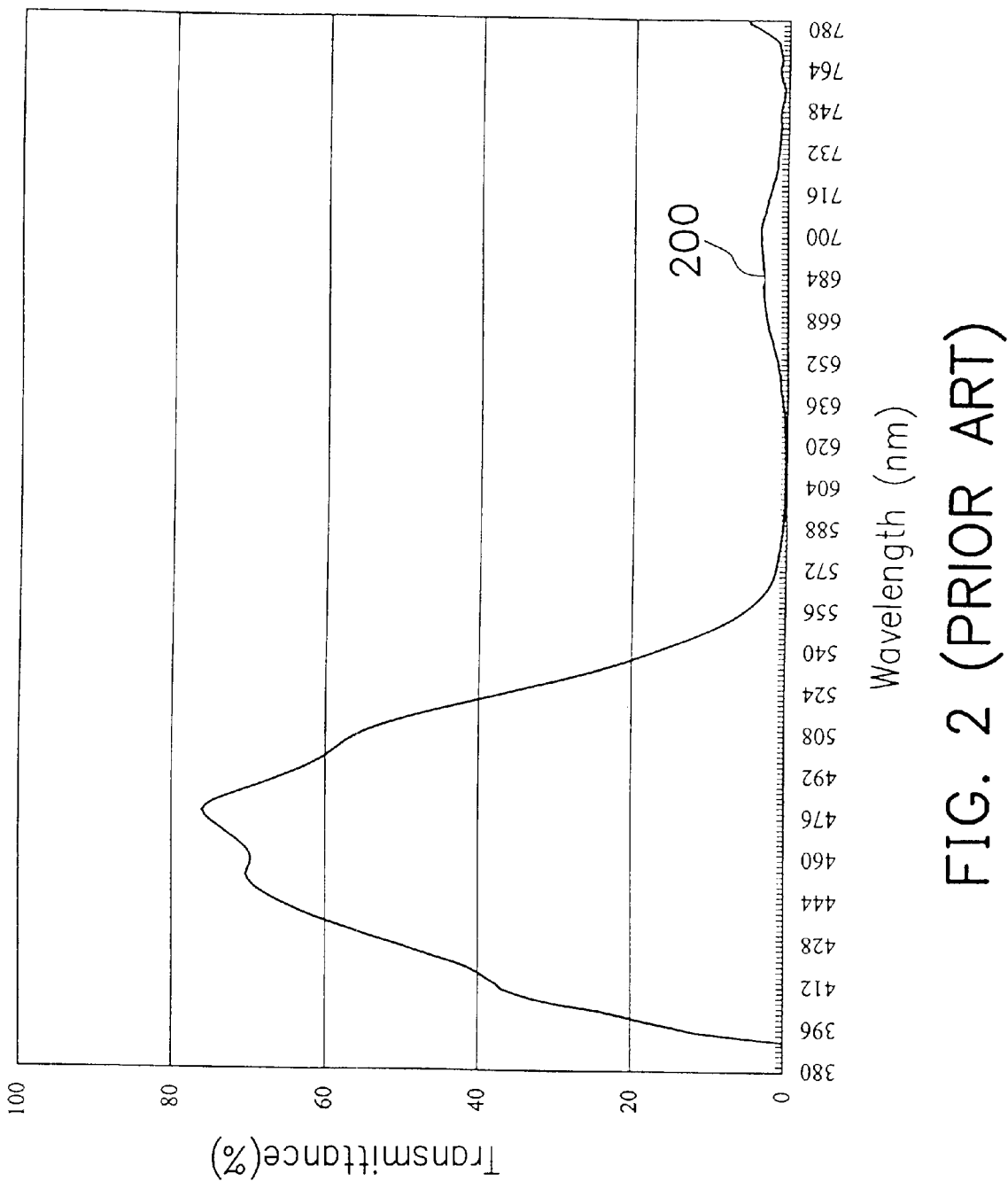
FIG. 2 shows transmittance of silicon nitride when the light passes through the silicon nitride layer via a blue color filter.

FIG. 3 shows a cross-sectional view illustrating a semi-conductor image sensor according to this invention. A sensor (not shown) including light-receiving portions and electric charge transfer portions such as CMOS fabricated by integrated circuit technology is formed on a semiconductor substrate 300. A bonding pad 302 is formed over the semiconductor substrate 300 to electrically connect to the device thereon. An oxide layer 304 such as silicon-rich oxide (SRO) or PSG is formed by chemical vapor deposition (CVD), for example, over the bonding pad 302 to serve as a part of a passivation layer. The passivation layer is used to prevent the underlying device from being mechanically damaged and penetrated by moisture and alkaloid ions. Simultaneously, the oxide layer 304 also improves adhesion between the semiconductor substrate 300, the bonding pad 302 and material in subsequent process.

Figure 4:
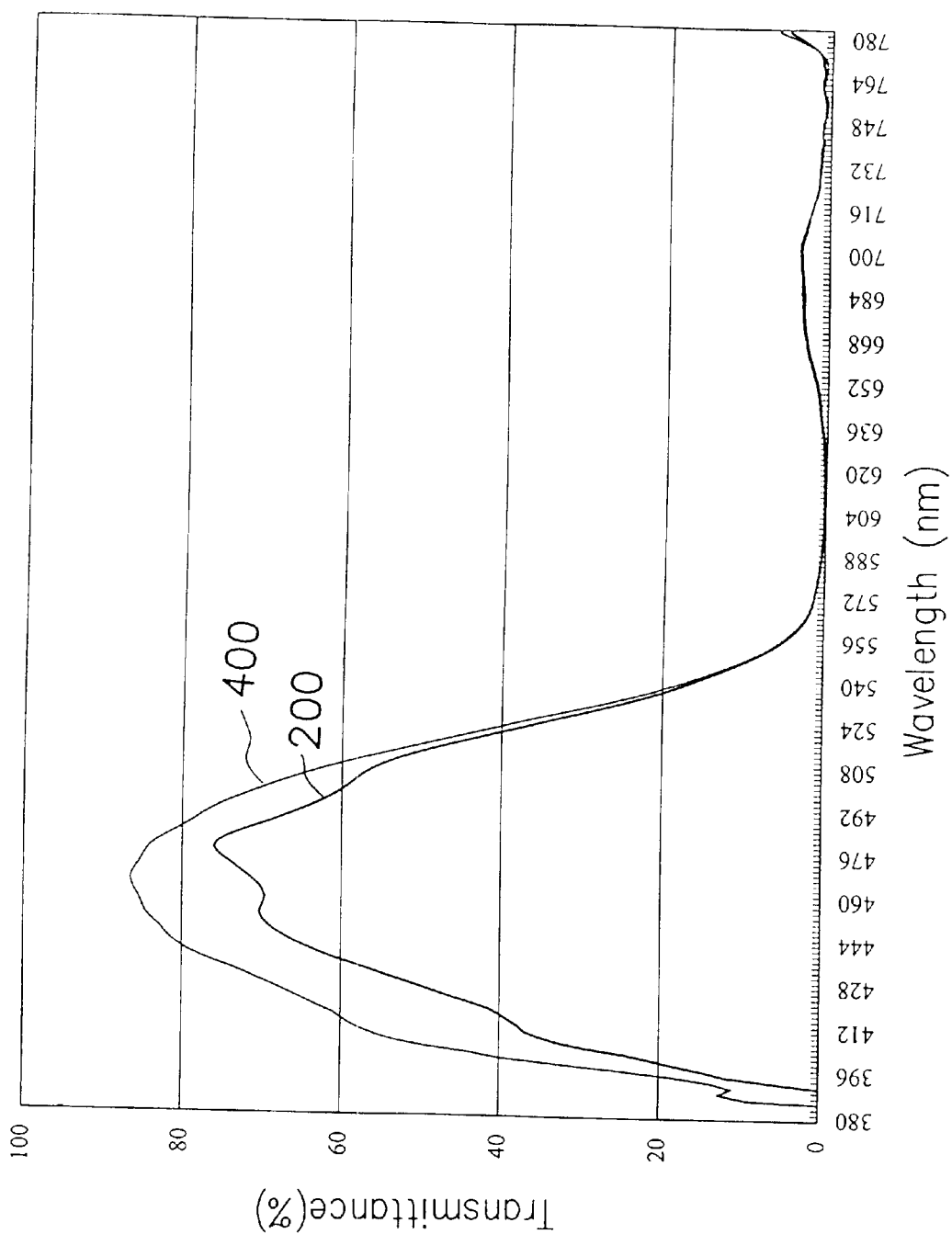
FIG. 4 shows transmittance of SOG when the light passes into the SOG through a blue color filter.

A spin-on-glass (SOG) 306 is then spun and coated on the oxide layer 306 with suitable solvent in which the SOG can be silicate or siloxane, for example. Liquid SOG 306 with high fluidity is employed as it is spin coated, so that a planar surface is provided over the oxide layer 304 by the SOG 306. In order to obtain a desired thickness and uniformity of the SOG 306, it is necessary to spin coat SOG 306 to a thickness of 2000 angstroms, twice. After the SOG 306 is formed, an etching back step is performed and as a result, an even topography is obtained on the SOG 306. However, the SOG 306 is not only used for a planarized material. The transmittance of the SOG 306 with blue light reaches 86% as the light passes through a blue color filter to then pass through the SOG 306, as indicated by curve 400 in FIG. 4. Therefore, the transmittance of the SOG 306 with blue light is raised by approximately 20% compared with the transmittance of the silicon nitride in prior art. Additionally, the SOG 306 is capable of anti-reflection and it is not difficult to etch the SOG 306, such that it can replace the plain film 106 (FIG. 1) in prior art for use as a preferred planarized material in present invention.

Figure 5:
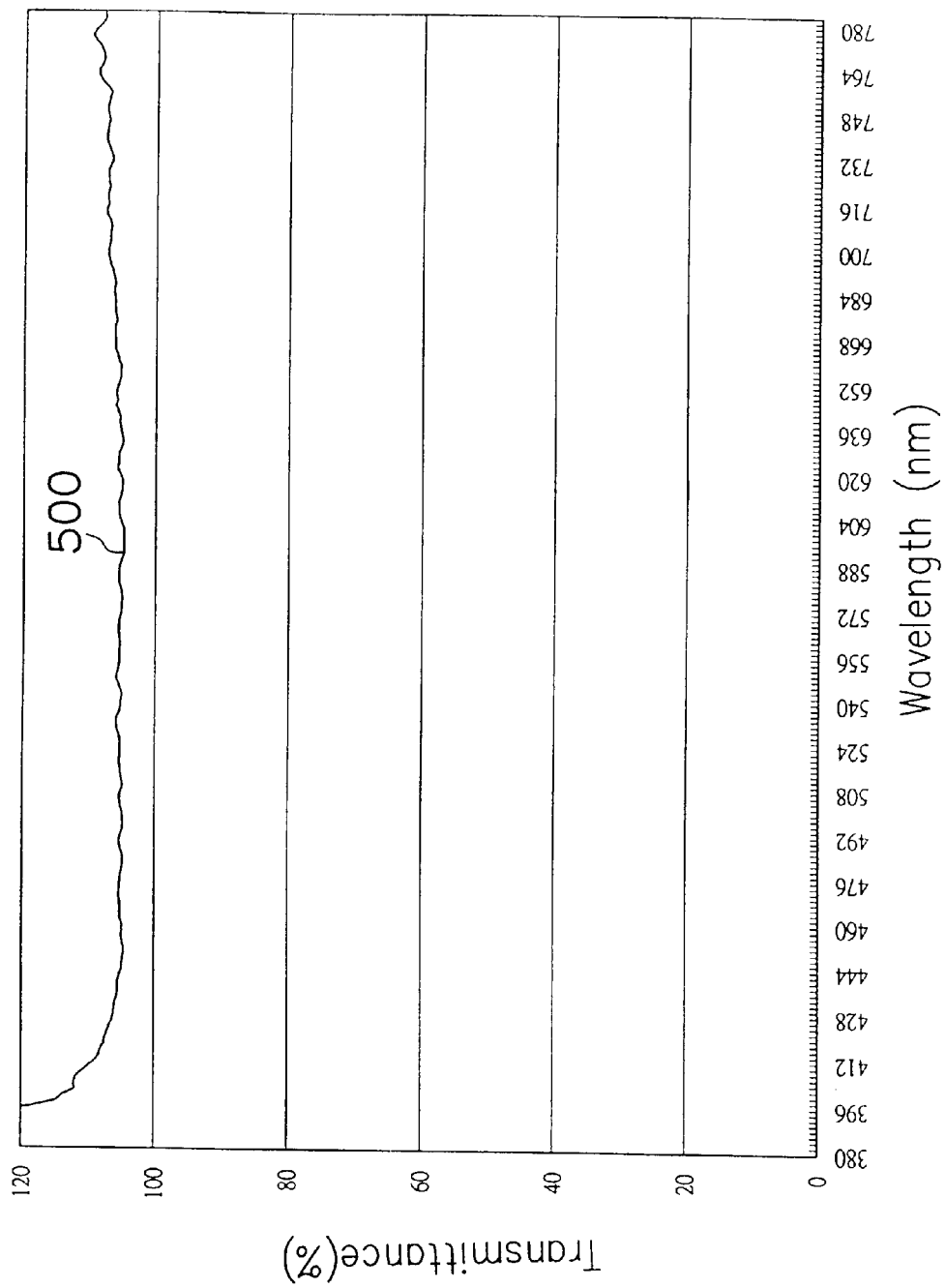
Figure 6:
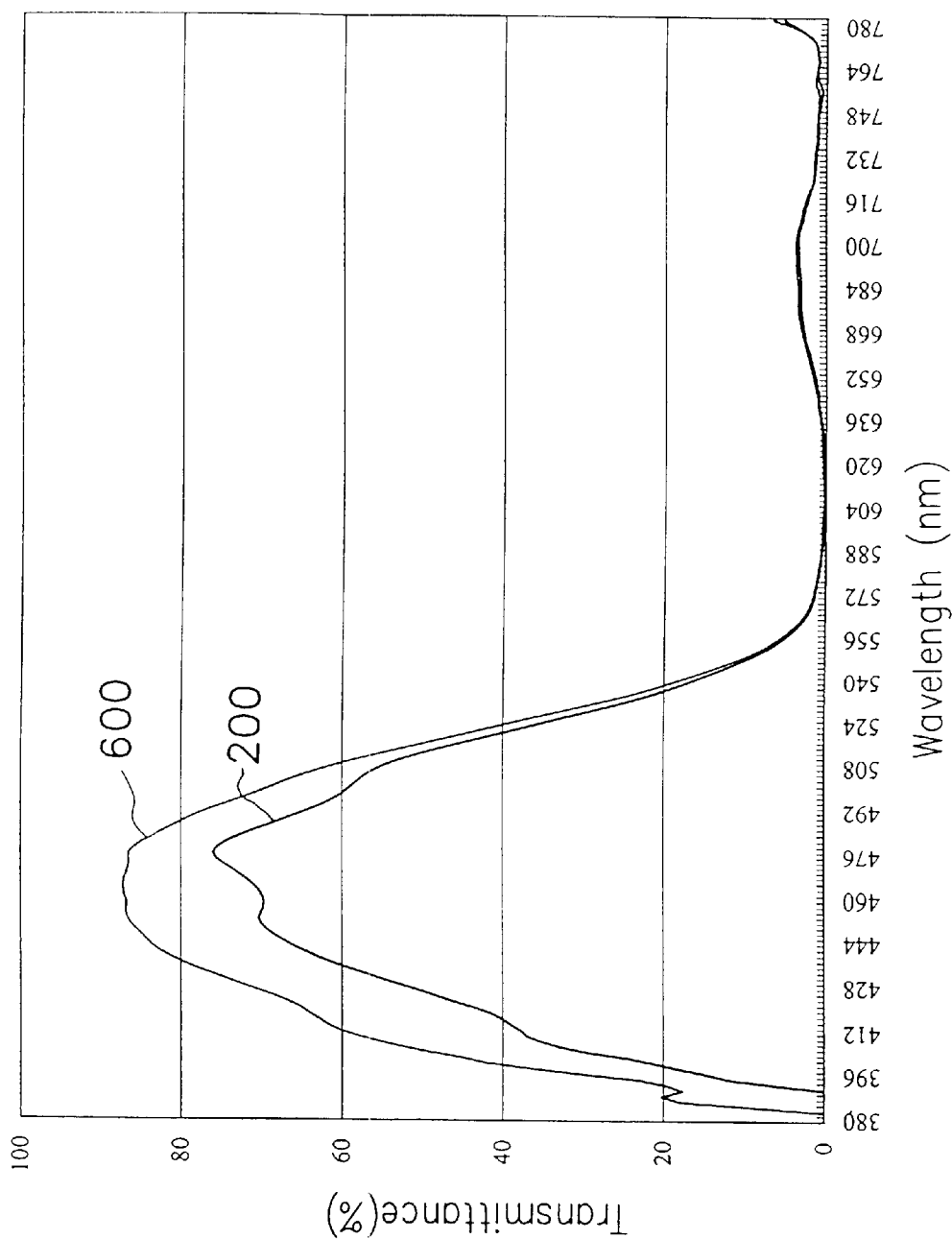
FIG. 6 shows transmittance of silicon-oxy-nitride layer when the light passes into the silicon-oxy-nitride through a blue color filter.

With further reference to FIG. 3, the use of plasma enhanced chemical vapor deposition (PECVD), for example, forms an oxide layer 308 on the SOG 306, thereby improving adhesion of SOG 306 and subsequent material. The oxide layer 308, such as TEOS oxide, is deposited by using tetra-ethyl-ortho-silicate (TEOS) as a source gas. The presence of the oxide layer 308 depends on requirements of the fabrication processes. Thereafter, a silicon-oxy-nitride layer 310 with a thickness of about 7000 angstroms is formed by chemical vapor deposition using $SiH_4$, $N_2O$ and $N_2$ as a gas source. The silicon-oxy-nitride layer 310 is used for a portion of passivation. The transmittance of silicon-oxy-nitride layer 310 for light reaches 100%, as indicated by curve 500 in FIG. 5, and the transmittance of the silicon-oxy-nitride layer 310 with blue light is approximately 84%, as indicated by curve 600 shown in FIG. 6. Therefore, the transmittance of the silicon-oxy-nitride layer 310 is also higher than the silicon nitride in prior art. Additionally, oxygen is released from the silicon-oxy-nitride layer 310, such that some cleaning processes are easily performed.

A color filter 312, such as blue color filter is then formed on the silicon-oxy-nitride layer 310. Blue light is therefore produced and is capable of passing through the material underlying the color filter 312 to the semiconductor substrate 300 when the light penetrates the blue color filter 312, as shown in FIG. 3.

Since the transmittance of the SOG 306 with blue light in this invention is higher than that of the silicon nitride layer in prior art and the transmittance of the silicon-oxy-nitride layer 310 with light is higher than that of the plain film, the total transmittance oft he silicon-oxy-nitride layer 310 and SOG 306 approaches 86%. As a result, the transmittance of the structure fabricated in this invention is increased, such that the light which arrives at the semiconductor substrate 300 is strong enough to induce current and the right information is therefore transmitted.

The thickness of the silicon-oxy-nitride layer 310 and the SOG 306 are thinner than the silicon nitride and the plain film in prior art and there is no problem with the etching process, such as etching polyimide. Accordingly, the etching time for etching these layers to expose the bonding pad 302 is reduced to 2 minutes per wafer and intervals between PMs can be prolonged.

This invention substitutes a SOG and silicon-oxy-nitride layer for the plain film and the silicon nitride layer of conventional art, thereby enhancing the blue light transmittance of the semiconductor image sensor by about 20%. In addition, the etching time is reduced and the interval between PMs is prolonged to shorten fabrication time and lower manufacturing costs. Therefore, this invention is particularly suitable for application in line and quantity production.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor image sensor, comprising:

a bonding pad formed over a semiconductor substrate on which semiconductor devices have been formed;

an oxide layer formed over the semiconductor substrate to cover the bonding pad;

a spin-on-glass formed on the oxide layer to planarize the oxide layer;

a TEOS oxide formed on the spin-on-glass;

a silicon-oxy-nitride layer formed on the TEOS oxide; and a color filter on the silicon-oxy-nitride layer.

2. The structure according to claim 1, wherein the oxide layer includes silicon-rich oxide.

3. The structure according to claim 1, wherein the color filter includes a blue color filter.

4. The structure according to claim 1, wherein a transmittance of the spin-on-glass is approximately 86% as the light passes through the spin-on-glass via the blue color filter.

5. The structure according to claim 1, wherein the thickness of the silicon-oxynitride layer is about 7000 angstroms.

* * * * *